US012648282B2

(12) United States Patent
Lee et al.

(10) Patent No.: US 12,648,282 B2
(45) Date of Patent: Jun. 2, 2026

(54) DISPLAY DEVICE

(71) Applicant: Samsung Display Co., LTD., Yongin-si (KR)

(72) Inventors: Jeongyoon Lee, Yongin-si (KR); Sunghoon Kim, Yongin-si (KR); Ok-Kyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 378 days.

(21) Appl. No.: 18/343,221

(22) Filed: Jun. 28, 2023

(65) Prior Publication Data

US 2024/0113269 A1 Apr. 4, 2024

(30) Foreign Application Priority Data

Sep. 26, 2022 (KR) ........................ 10-2022-0121637

(51) Int. Cl.
| | |
|---|---|
| *H10H 20/857* | (2025.01) |
| *G09G 3/32* | (2016.01) |
| *H10W 90/00* | (2026.01) |

(52) U.S. Cl.
CPC ............. *H10H 20/857* (2025.01); *G09G 3/32* (2013.01); *H10W 90/00* (2026.01); *G09G 2310/0267* (2013.01)

(58) Field of Classification Search
CPC ............... H10H 20/857; H10W 90/00; G09G 2310/0267; G09G 2300/0426; G09G 2300/0452; G09G 3/3275; G09G 3/32; H01L 25/167; H01L 25/0753; H10K 59/131; H10K 59/1213; H10K 77/10
See application file for complete search history.

(56) References Cited

U.S. PATENT DOCUMENTS

| | | | |
|---|---|---|---|
| 2019/0103455 A1 | 4/2019 | Song et al. | |
| 2021/0143237 A1 | 5/2021 | Lee et al. | |
| 2022/0045151 A1* | 2/2022 | Jeong ..................... | H10K 59/80 |
| 2022/0077271 A1* | 3/2022 | Lee ....................... | H10K 59/131 |
| 2022/0149129 A1* | 5/2022 | Park ...................... | H10K 59/121 |
| 2022/0189358 A1 | 6/2022 | Kim et al. | |
| 2022/0208093 A1* | 6/2022 | Keum .................. | G09G 3/3225 |
| 2022/0216276 A1* | 7/2022 | Lee ....................... | H10K 59/131 |
| 2022/0285452 A1* | 9/2022 | Kang ..................... | H10K 59/65 |
| 2022/0285456 A1* | 9/2022 | Hong .................. | H10K 59/122 |
| 2022/0302243 A1* | 9/2022 | Jang ................... | H10K 59/1213 |

(Continued)

FOREIGN PATENT DOCUMENTS

| | | |
|---|---|---|
| KR | 10-2011-0114266 A | 10/2011 |
| KR | 10-2018-0018960 A | 2/2018 |

(Continued)

*Primary Examiner* — Victor A Mandala
(74) *Attorney, Agent, or Firm* — Womble Bond Dickinson (US) LLP

(57) ABSTRACT

A display device includes a substrate defining a display area, and a peripheral area adjacent to the display area in a first direction, data lines in the display area above the substrate, and extending in the first direction, pixel circuits in the peripheral area above the substrate, light-emitting diodes in the peripheral area above the substrate, and respectively coupled to the pixel circuits, and fan-out lines in the peripheral area above the substrate, respectively coupled to the data lines, and spaced apart from the pixel circuits on a plane.

20 Claims, 12 Drawing Sheets

(56)        References Cited

U.S. PATENT DOCUMENTS

| | | | | |
|---|---|---|---|---|
| 2022/0310761 A1* | 9/2022 | Kim | ..................... | H10K 59/123 |
| 2023/0021482 A1* | 1/2023 | Choi | .................. | H10K 59/1213 |
| 2023/0030096 A1* | 2/2023 | Lee | ..................... | H10K 59/124 |
| 2023/0119107 A1* | 4/2023 | Jeong | ................... | G09G 3/3233 |
| | | | | 345/76 |
| 2023/0146971 A1* | 5/2023 | Ju | ........................ | H10K 59/131 |
| | | | | 257/72 |
| 2023/0354656 A1* | 11/2023 | Long | ................... | H10K 59/131 |
| 2024/0023390 A1* | 1/2024 | Lee | ..................... | H10K 59/131 |

FOREIGN PATENT DOCUMENTS

| | | | |
|---|---|---|---|
| KR | 10-2019-0038718 | A | 4/2019 |
| KR | 10-2020-0031194 | A | 3/2020 |
| KR | 10-2021-0010716 | A | 1/2021 |
| KR | 10-2021-0055850 | A | 5/2021 |
| KR | 10-2022-0083911 | A | 6/2022 |

* cited by examiner

10

DL

SUB

DA2

GL

GDV

PX

EDV

ECL

DA1

A

B

FOL

PA

DDV

D2

D1

F I G . 2
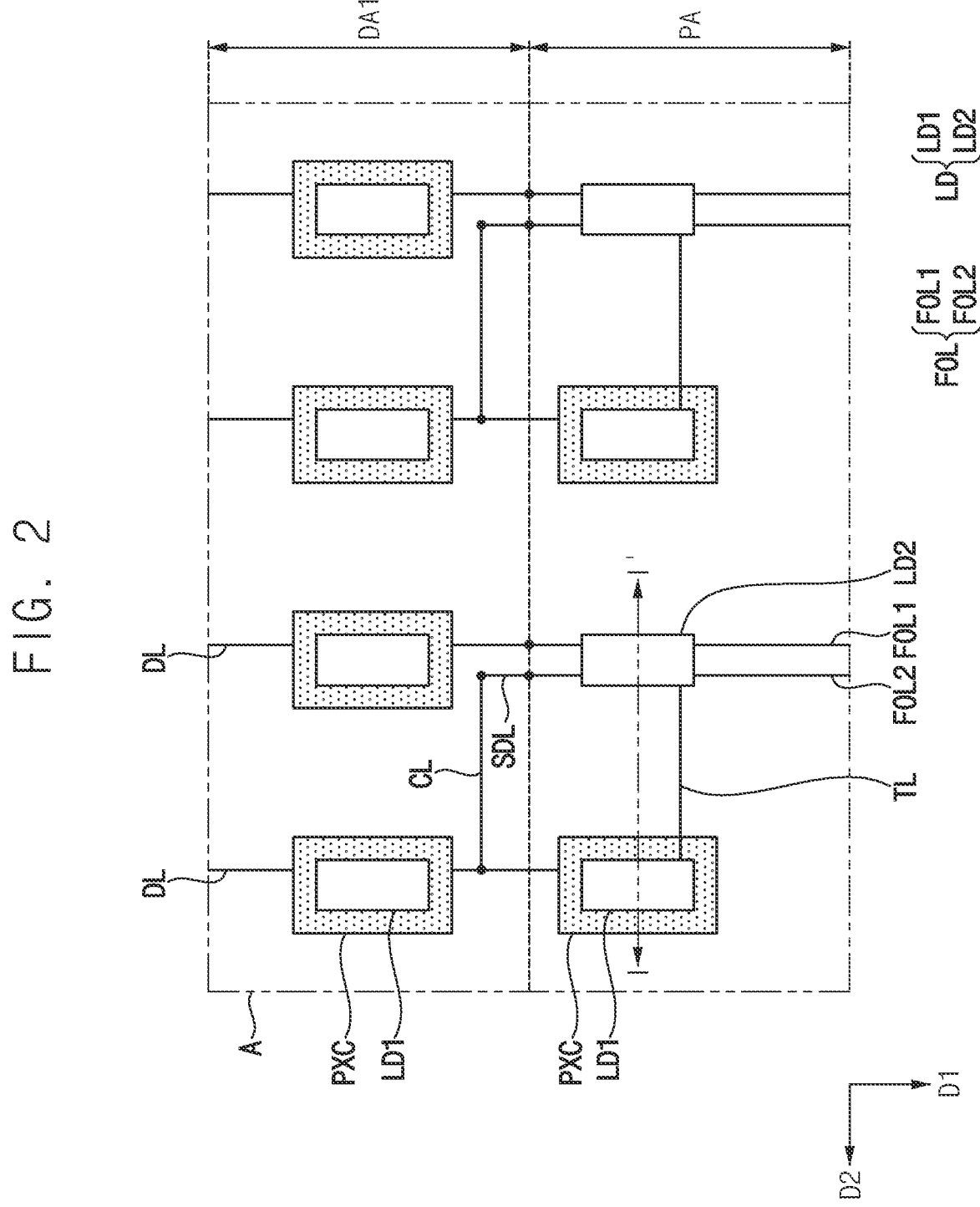

F I G. 5
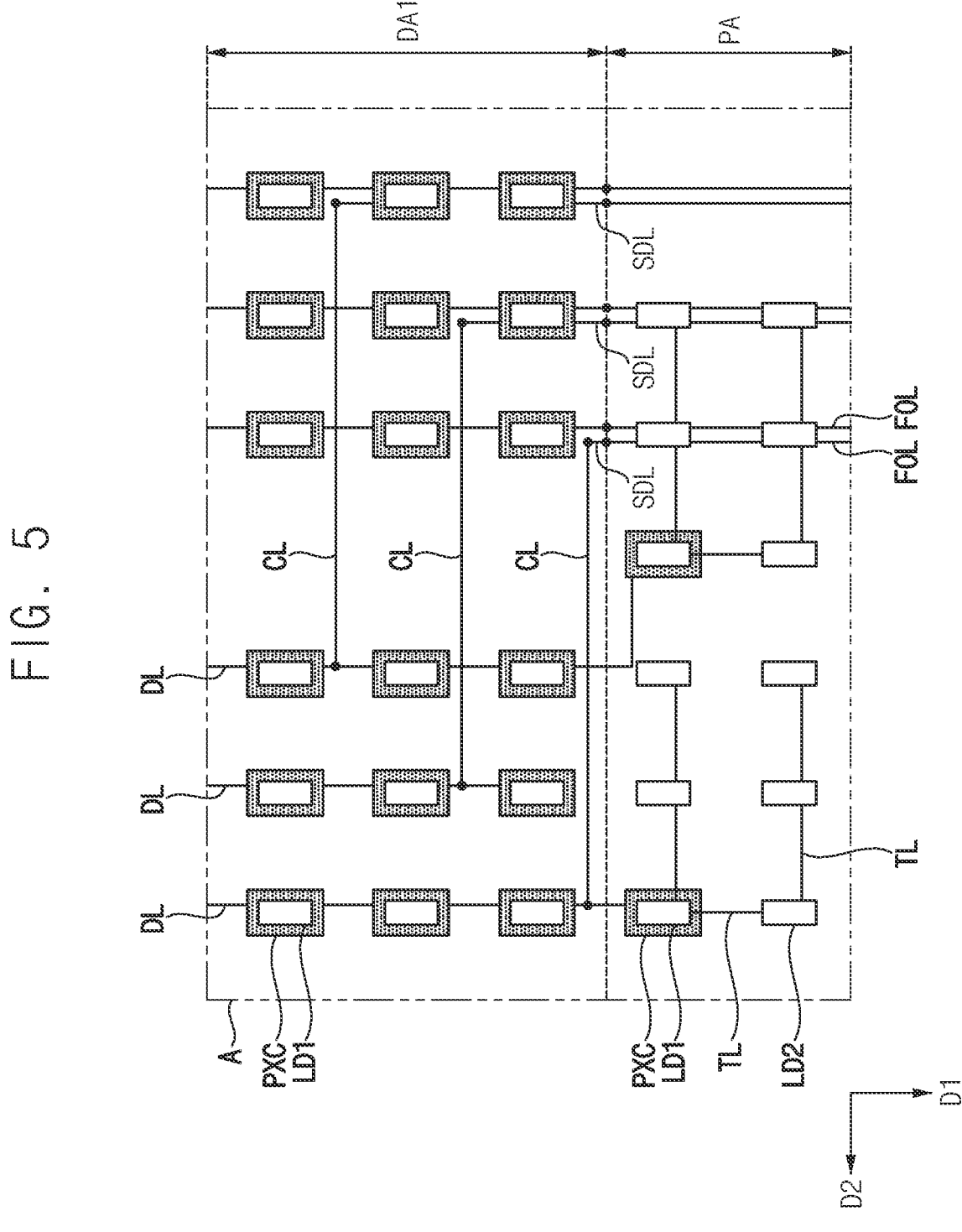

F I G. 7
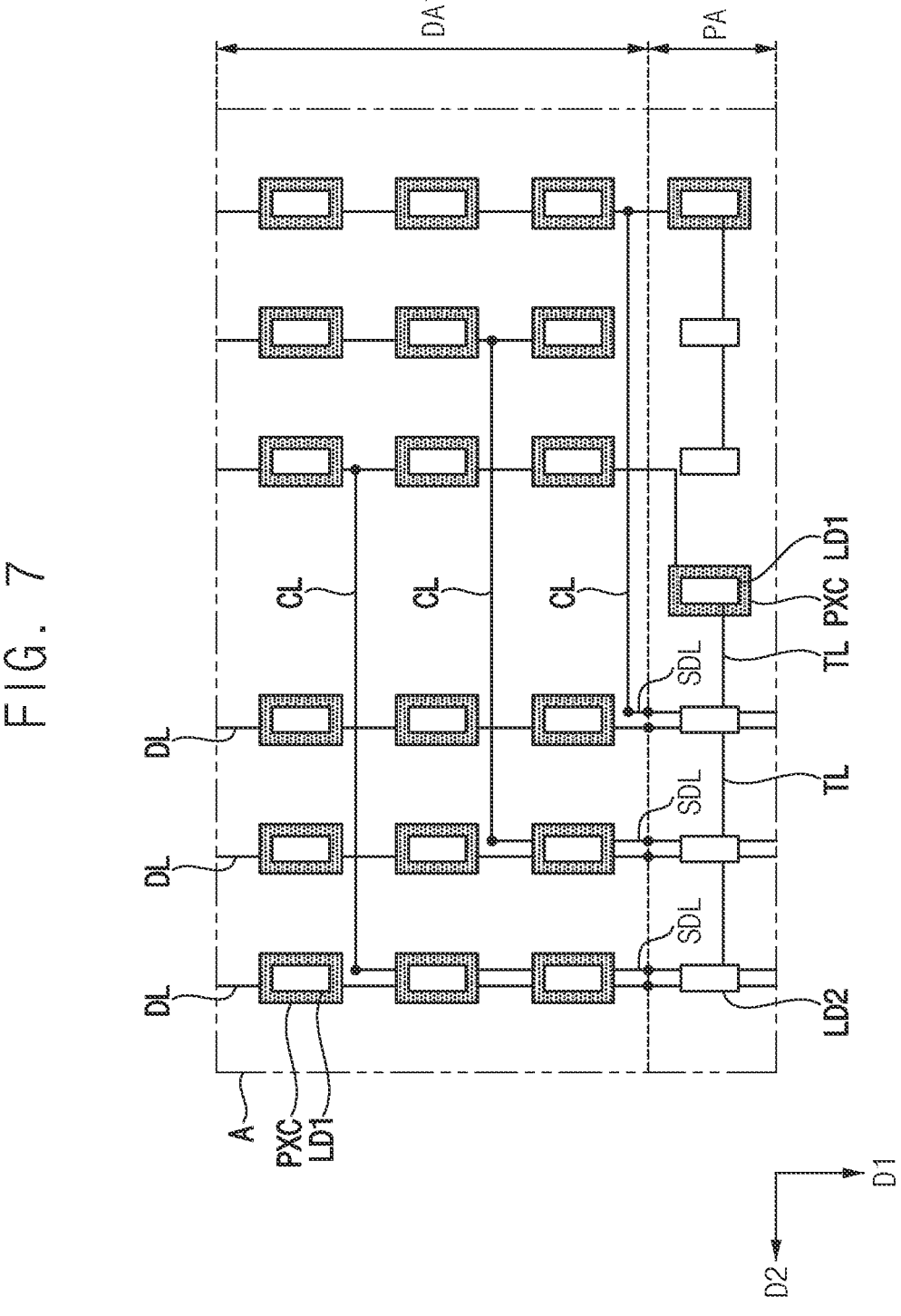

20

DL

SUB

DA2

GL

GDV

PX

EDV

ECL

DA1

C

D

FOL

PA

DDV

D2

D1

DISPLAY DEVICE

CROSS-REFERENCE TO RELATED APPLICATION(S)

This application claims priority to, and the benefit of, Korean Patent Application No. 10-2022-0121637 filed on Sep. 26, 2022, in the Korean Intellectual Property Office (KIPO), the entire disclosure of which is incorporated by reference herein.

BACKGROUND

1. Field

Embodiments relate to a display device that provides visual information.

2. Description of the Related Art

A display device may display an image (e.g., a predetermined image) by including a driving diode (e.g., a transistor) and a light-emitting diode (e.g., an organic light-emitting diode) that emits light by receiving a voltage or signal from the driving diode. To provide the voltage or signal to the light-emitting diodes, drivers, lines, and the like are located in a non-display area of the display device.

An image is not displayed in the non-display area where the light-emitting diodes are not located. The non-display area in which the image is not displayed is referred to as a dead space.

SUMMARY

Embodiments provide a display device with improved display quality.

A display device according to one or more embodiments of the present disclosure may include a substrate defining a display area, and a peripheral area adjacent to the display area in a first direction, data lines in the display area above the substrate, and extending in the first direction, pixel circuits in the peripheral area above the substrate, light-emitting diodes in the peripheral area above the substrate, and respectively coupled to the pixel circuits, and fan-out lines in the peripheral area above the substrate, respectively coupled to the data lines, and spaced apart from the pixel circuits on a plane.

The light-emitting diodes may include a first light-emitting diode respectively overlapping the pixel circuits on the plane, and a second light-emitting diode spaced apart from the pixel circuits on the plane.

The first light-emitting diode and the second light-emitting diode may be coupled to a same one of the pixel circuits through a transmission line.

The second light-emitting diode may overlap at least one of the fan-out lines on the plane.

The display device may further include a connection line in the display area above the substrate, extending in a second direction crossing the first direction, and coupling at least one of the fan-out lines to a respective one of the data lines.

The fan-out lines may be adjacent to a center of the peripheral area, wherein the pixel circuits are respectively at a first end spaced apart from the center of the peripheral area in a second direction crossing the first direction, and at a second end opposite to the first end.

The pixel circuits may be adjacent to a center of the peripheral area, wherein the fan-out lines are respectively at a first end spaced apart from the center of the peripheral area in a second direction crossing the first direction, and at a second end opposite to the first end.

The display device may further a driver in an area adjacent to the display area above the substrate.

The driver may include a first gate driver configured to provide a first signal to one of the pixel circuits in the display area, and a second gate driver spaced apart from the first gate driver, and configured to provide a second signal that is identical to the first signal to another one of the pixel circuits in the peripheral area.

The driver may include a first light-emitting driver configured to provide a first signal to one of the pixel circuits in the display area, and a second light-emitting driver spaced apart from the first light-emitting driver, and configured to provide a second signal that is identical to the first signal to another one of the pixel circuits in the peripheral area.

A display device according to one or more embodiments of the present disclosure may include a substrate defining a display area, and a peripheral area adjacent to the display area, at least one circuit structure in the peripheral area above the substrate, and defining a pixel circuit, a first fan-out line in the peripheral area above the substrate, and spaced apart from the circuit structure on a plane, a second fan-out line above the first fan-out line, a transmission line above the second fan-out line, and a first pixel electrode and a second pixel electrode above the transmission line, and coupled to the transmission line.

The first pixel electrode may overlap the circuit structure on the plane, wherein the second pixel electrode is spaced apart from the circuit structure on the plane.

The display device may further an insulating layer above the transmission line, wherein a first contact hole and a second contact hole are defined by the insulating layer, wherein the first pixel electrode contacts the transmission line through the first contact hole, and wherein the second pixel electrode contacts the transmission line through the second contact hole.

The second pixel electrode may overlap the first fan-out line or the second fan-out line on the plane.

The transmission line may be coupled to the circuit structure.

The display device may further data lines in the display area above the substrate, wherein the first fan-out line and the second fan-out line are coupled to the data lines, respectively.

The display device may further a connection line above the substrate, wherein the first fan-out line or the second fan-out line is coupled to one of the data lines through the connection line.

The connection line may be in the display area.

The circuit structure may include an active pattern above the substrate, a first gate electrode above the active pattern, and a second gate electrode above the first gate electrode.

The first gate electrode may be above a same layer as the first fan-out line, wherein the second gate electrode is above a same layer as the second fan-out line.

In a display device according to embodiments of the present disclosure, the display device may include pixel circuits and light-emitting diodes located in a peripheral area adjacent to a display area. Fan-out lines may be located in the peripheral area, and the fan-out lines may supply data voltages from a data driver to the pixel circuits. Because the pixel circuits are spaced apart from the fan-out lines, and because two or more the light-emitting diodes are connected to one pixel circuit through a transmission line, a light-emitting area of the display device may be expanded downward. Accordingly, a dead space of the display device may be reduced.

BRIEF DESCRIPTION OF THE DRAWINGS

FIG. 2 is an enlarged plan view of area A of FIG. 1.

FIG. 5 is a plan view illustrating another example of FIG. 2.

FIG. 7 is a plan view illustrating still another example of FIG. 2.

DETAILED DESCRIPTION

Figure 1:
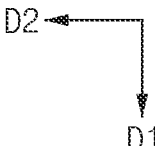
FIG. 1 is a plan view illustrating a display device according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "(operatively or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XYY, YZ, and ZZ, or any variation thereof. Similarly, the expression such as "at least one of A and B" and "at least one of A or B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view illustrating a display device according to one or more embodiments.

Referring to FIG. 1, a display device 10 may include a substrate SUB. A first display area DA1, a peripheral area PA, and a second display area DA2 may be defined on the substrate SUB. Each of the first display area DA1, the peripheral area PA, and the second display area DA2 may be an area capable of generating light and displaying an image.

A plurality of pixels PX for emitting light may be located in the first display area DA1, and accordingly, an image may be displayed in the first display area DA1. The pixels PX may be arranged in a matrix form along a first direction D1, and along a second direction D2 crossing the first direction D1. For example, the second direction D2 may be perpendicular to the first direction D1. Each of the pixels PX may include a light-emitting diode (e.g., a light-emitting diode LD of FIG. 2), and a pixel circuit for driving the light-emitting diode (e.g., a pixel circuit PXC of FIG. 2). In one or more embodiments, the light-emitting diode may include an organic light-emitting diode, and the pixel circuit may include at least one thin film transistor.

Lines for providing voltages or signals to the pixels PX may be located in the first display area DA1. For example, a plurality of data lines DL, gate lines GL and light-emitting control lines ECL may be located in the first display area DA1. In addition, driving voltage lines, initialization voltage lines, and/or the like may be located in the first display area DA1.

Each of the data lines DL may extend along the first direction D1, and may be arranged along the second direction D2. The data lines DL may supply a data voltage to each of the pixels PX. Each of the gate lines GL may extend along the second direction D2 crossing the first direction D1, and may supply a gate signal (or scan signal) to each of the pixels PX. Each of the light-emitting control lines ECL may extend along the second direction D2 parallel to the gate line GL, and may supply a light-emitting control signal to each of the pixels PX. Each of the driving voltage lines may extend along the first direction D1 parallel to the data line DL, and may supply a high power supply voltage to each of the pixels PX. Each of the initialization voltage lines may extend along the second direction D2 parallel to the gate line GL, and may supply an initialization voltage to each of the pixels PX.

The peripheral area PA may be adjacent to the first display area DA1 in the first direction D1. For example, the peripheral area PA may be located between the first display area DA1 and a data driver DDV on a plane. A plurality of fan-out lines FOL may be located in the peripheral area PA. Each of the fan-out lines FOL may extend along the first direction D1, and may be arranged along the second direction D2. Each of the fan-out lines FOL may be connected to the data line DL. In one or more embodiments, a plurality of pixels PX may be located in the peripheral area PA, and accordingly, an image may be displayed in the peripheral area PA as well.

The second display area DA2 may surround at least a portion of each of the first display area DA1 and the peripheral area PA. For example, the second display area DA2 may entirely surround the first display area DA1 and the peripheral area PA. Drivers for displaying an image of the first display area DA1, the peripheral area PA, and the second display area DA2 may be located in the second display area DA2. For example, the drivers may include the data driver DDV for generating the data voltage, a gate driver GDV for generating the gate signal, and a light-emitting driver EDV for generating the light-emitting control signal. In one or more embodiments, a plurality of pixels PX may be located in the second display area DA2, and accordingly, an image may be displayed in the second display area DA2 as well.

The data driver DDV may be located below the first display area DA1 on a plane. For example, the data driver DDV may be located apart from the peripheral area PA in the first direction D1. The data driver DDV may be connected to the fan-out lines FOL. The data driver DDV may generate the data voltage, and may supply the data voltage to the data lines DL through the fan-out lines FOL. In one or more embodiments, the data driver DDV may be implemented with one or more integrated circuits (ICs). In one or more other embodiments, the data driver DDV may be located outside the display device 10, and may be electrically connected to the display device 10.

The gate driver GDV may be located on a left and/or right side of the display device 10 on a plane. For example, the gate driver GDV may be located apart from the first display area DA1 in the second direction D2 and/or in a direction opposite to the second direction D2. The gate driver GDV may generate the gate signal, and may supply the gate signal to the gate lines GL. In one or more embodiments, the gate driver GDV may be implemented with one or more integrated circuits.

The light-emitting driver EDV may be located on the left side and/or the right side of the display device 10 on a plane. For example, the light-emitting driver EDV may be located apart from the first display area DA1 in the second direction D2 and/or in the direction opposite to the second direction D2. The light-emitting driver EDV may generate the light-emitting control signal, and may supply the light-emitting control signal to the light-emitting control lines ECL. In one or more embodiments, the light-emitting driver EDV may be implemented with one or more integrated circuits.

Figure 3:
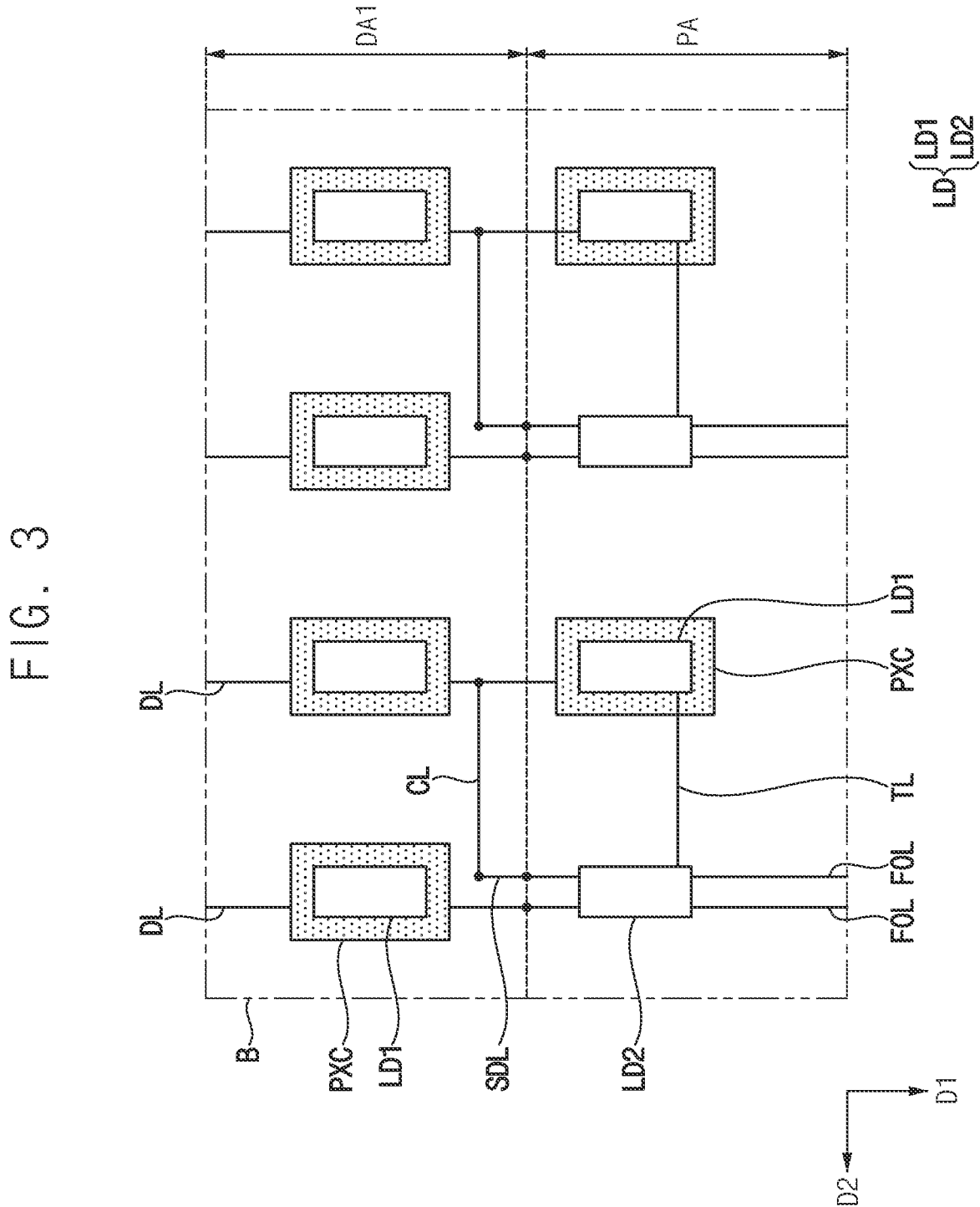
FIG. 3 is an enlarged plan view of area B of FIG. 1.

FIG. 2 is an enlarged plan view of area A of FIG. 1. FIG. 3 is an enlarged plan view of area B of FIG. 1. For example, FIGS. 2 and 3 may be plan views illustrating an example of portions of the first display area DA1 and the peripheral area PA of the substrate SUB included in the display device 10.

Referring to FIGS. 2 and 3, pixel circuits PXC, light-emitting diodes LD, the data lines DL, the fan-out lines FOL, auxiliary data lines SDL, connection lines CL, and transmission lines TL may be located on or above the substrate SUB.

Each of the pixel circuits PXC and the light-emitting diodes LD may constitute pixels (e.g., the pixels PX of FIG. 1). At least one of the light-emitting diodes LD may be connected to each of the pixel circuits PXC. In FIGS. 2 and 3, each of the pixels is illustrated as having a rectangular planar shape, but the present disclosure is not limited thereto.

In one or more embodiments, the light-emitting diodes LD may include a first light-emitting diode LD1 overlapping each of the pixel circuits PXC on a plane, and a second light-emitting diode LD2 spaced apart from each of the pixel circuits PXC on a plane. For example, the first light-emitting diode LD1 may be located in the first display area DA1, and the first light-emitting diode LD1 and the second light-emitting diode LD2 may be located in the peripheral area PA.

Each of the data lines DL may be connected to the pixel circuits PXC along the first direction D1 in the first display area DA1. That is, each of the data lines DL may supply the data voltage to the pixel circuits PXC along the first direction D1. In addition, some of the data lines DL may extend to the peripheral area PA along the first direction D1 to supply the data voltage to the pixel circuits PXC located in the peripheral area PA.

Each of the fan-out lines FOL may extend along the first direction D1 in the peripheral area PA, and may be spaced apart from the pixel circuits PXC on a plane. That is, each of the fan-out lines FOL may be spaced apart from an adjacent first light-emitting diode LD1 on a plane. In other words, each of the fan-out lines FOL may not overlap the pixel circuits PXC and the first light-emitting diode LD1 on a plane. The fan-out lines FOL may include a first fan-out line FOL1 and a second fan-out line FOL2.

Each of the fan-out lines FOL may be connected to the data lines DL to supply the data voltage to the data lines DL. In one or more embodiments, at least one of the fan-out lines FOL may overlap the second light-emitting diode LD2 on a plane, but the present disclosure is not limited thereto. For example, each of the fan-out lines FOL may be spaced apart from the second light-emitting diode LD2 on a plane.

Each of the auxiliary data lines SDL may extend along the first direction D1 in the first display area DA1, and each of the connection lines CL may extend along the second direction D2 in the first display area DA1. In one or more embodiments, each of the auxiliary data lines SDL and connection lines CL may be connected to each other. For example, each of the auxiliary data lines SDL may be connected to respective ones of the fan-out lines FOL and the connection lines CL, and each of the connection lines CL may be connected to respective ones of the auxiliary data lines SDL and the data lines DL. That is, each of the auxiliary data lines SDL and connection lines CL may connect respective ones of the fan-out lines FOL and the data lines DL.

Each of the transmission lines TL may extend along the second direction D2 in the peripheral area PA. In one or more embodiments, each of the transmission lines TL may connect the first light-emitting diode LD1 and the second light-emitting diode LD2 to a same one pixel circuit PXC among the pixel circuits PXC. That is, each of the transmission lines TL may connect a first light-emitting diode LD1, and a second light-emitting diode LD2 that is adjacent to the first light-emitting diode LD1, to connect the first light-emitting diode LD1 and the second light-emitting diode LD2 to the pixel circuit PXC overlapping the first light-emitting diode LD1. In other words, the first light-emitting diode LD1 and the second light-emitting diode LD2 may share the same pixel circuit PXC through the transmission line TL.

In FIGS. 2 and 3, each of the transmission lines TL is illustrated as connecting one first light-emitting diode LD1 and one second light-emitting diode LD2, but the present disclosure is not limited thereto. For example, each of the transmission lines TL may connect two or more first light-emitting diodes LD1 and two or more second light-emitting diodes LD2.

Figure 4:
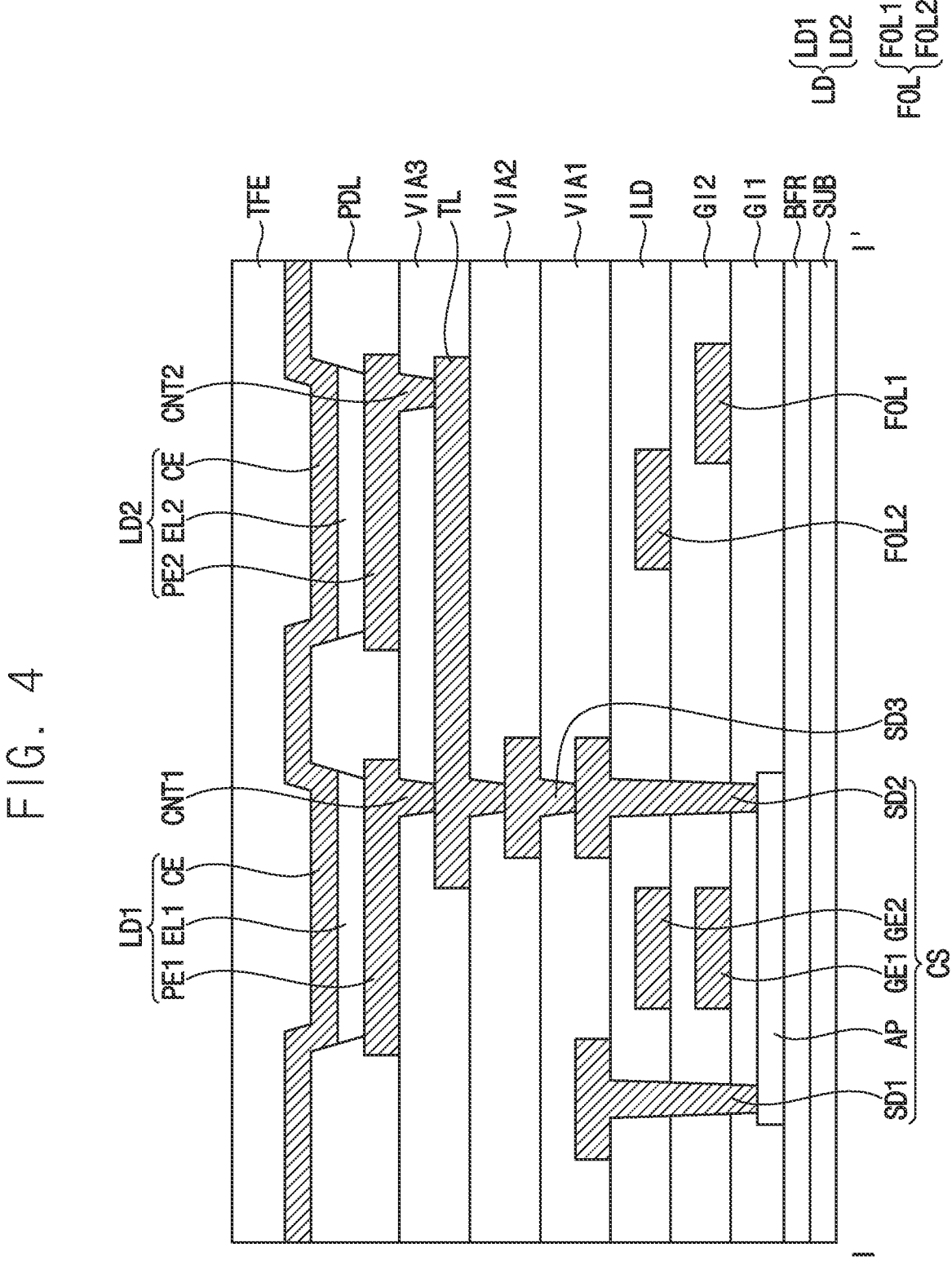
FIG. 4 is a cross-sectional view taken along the line I-I' of FIG. 2.

FIG. 4 is a cross-sectional view taken along the line I-I' of FIG. 2.

Referring to FIG. 4, the display device 10 may include the substrate SUB, a buffer layer BFR, an active pattern AP, a first gate-insulating layer GI1, a first gate electrode GE1, the first fan-out line FOL1, a second gate-insulating layer GI2, a second gate electrode GE2, the second fan-out line FOL2, an interlayer insulating layer ILD, a first electrode SD1, a second electrode SD2, a first via insulating layer VIA1, a third electrode SD3, a second via insulating layer VIA2, the transmission line TL, a third via insulating layer VIA3, a first pixel electrode PE1, a second pixel electrode PE2, a pixel defining layer PDL, a first light-emitting layer EL1, a second light-emitting layer EL2, a common electrode CE, and an encapsulation layer TFE.

The substrate SUB may include a transparent material or an opaque material. Examples of materials that may be used as the substrate SUB may include glass, plastic, and/or the like.

The buffer layer BFR may be located on the substrate SUB. In one or more embodiments, the buffer layer BFR may include an inorganic insulating material. Examples of inorganic insulating materials that may be used as the buffer layer BFR may include silicon oxide ($SiO_x$), silicon nitride ($SiN_x$), silicon oxynitride ($SiO_xN_y$), and/or the like. These may be used alone or in combination with each other. The buffer layer BFR may reduce or prevent metal atoms or impurities penetrating into the active pattern AP. In addition, the buffer layer BFR may control a heat supply rate during a crystallization process for forming the active pattern AP.

The active pattern AP may be located on the buffer layer BFR. In one or more embodiments, the active pattern AP may include a silicon semiconductor material or an oxide semiconductor material. Examples of silicon semiconductor materials that may be used as the active pattern AP may include amorphous silicon, polycrystalline silicon, and/or the like. Examples of oxide semiconductor materials that may be used as the active pattern AP may include indium gallium zinc oxide (IGZO), indium tin zinc oxide (ITZO), and/or the like. These may be used alone or in combination with each other. The active pattern AP may have a source area, a drain area, and a channel area positioned between the source area and the drain area.

The first gate-insulating layer GI1 may be located on the buffer layer BFR, and may cover the active pattern AP. In one or more embodiments, the first gate-insulating layer GI1 may include an inorganic insulating material. Examples of inorganic insulating materials that may be used as the first gate-insulating layer GI1 may include silicon oxide, silicon nitride, silicon oxynitride, and/or the like. These may be used alone or in combination with each other.

Each of the first gate electrode GE1 and the first fan-out line FOL1 may be located on the first gate-insulating layer GI1. The first gate electrode GE1 may overlap the channel area of the active pattern AP, and the first fan-out line FOL1 may be spaced apart from the first gate electrode GE1. In one or more embodiments, each of the first gate electrode GE1 and the first fan-out line FOL1 may include a conductive material. Examples of conductive materials that may be used as each of the first gate electrode GE1 and the first fan-out line FOL1 may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), and/or the like. These may be used alone or in combination with each other.

The first fan-out line FOL1 may include a same material as the first gate electrode GE1, and may be located on a same layer as the first gate electrode GE1. That is, the first fan-out line FOL1 may be formed using the same material as the first gate electrode GE1 through a same process.

The second gate-insulating layer GI2 may be located on the first gate-insulating layer GI1, and may cover the first gate electrode GE1 and the first fan-out line FOL1. In one or more embodiments, the second gate-insulating layer GI2 may include an inorganic insulating material. Examples of inorganic insulating materials that may be used as the second gate-insulating layer GI2 may include silicon oxide, silicon nitride, silicon oxynitride, and/or the like. These may be used alone or in combination with each other.

Each of the second gate electrode GE2 and the second fan-out line FOL2 may be located on the second gate-insulating layer GI2. The second gate electrode GE2 may overlap the first gate electrode GE1, and the second fan-out line FOL2 may be spaced apart from the second gate electrode GE2. In one or more embodiments, each of the second gate electrode GE2 and the second fan-out line FOL2 may include a conductive material. Examples of the conductive material that may be used as each of the second gate electrode GE2 and the second fan-out line FOL2 may include aluminum, platinum, palladium, silver, magnesium, gold, nickel, neodymium, iridium, chromium, lithium, calcium, molybdenum, titanium, tungsten, copper, and/or the like. These may be used alone or in combination with each other.

The second fan-out line FOL2 may include a same material as the second gate electrode GE2, and may be located on a same layer as the second gate electrode GE2. That is, the second fan-out line FOL2 may be formed using the same material as the second gate electrode GE2 through a same process.

In FIG. 4, the fan-out lines FOL is illustrated as including two lines (the first fan-out line FOL1 and the second fan-out line FOL2), but the present disclosure is not limited thereto. For example, the fan-out lines FOL may include three or more lines.

In addition, in FIG. 4, it is illustrated that the first fan-out line FOL1 is located on the same layer as the first gate electrode GE1 and includes the same material as the first gate electrode GE1, and the second fan-out line FOL2 is located on the same layer as the second gate electrode GE2 and includes the same material as the second gate electrode GE2, but the present disclosure is not limited thereto. For example, each of the first fan-out line FOL1 and the second fan-out line FOL2 may be located on a different layer from each of the first gate electrode GE1 and the second gate electrodes GE2, and may include a different material from each of the first gate electrode GE1 and the second gate electrodes GE2.

The interlayer insulating layer ILD may be located on the second gate-insulating layer GI2, and may cover the second gate electrode GE2 and the second fan-out line FOL2. In one or more embodiments, the interlayer insulating layer ILD may include an inorganic insulating material. Examples of inorganic insulating materials that may be used as the interlayer insulating layer ILD may include silicon oxide, silicon nitride, silicon oxynitride, and/or the like. These may be used alone or in combination with each other.

The first electrode SD1 and the second electrode SD2 may be located on the interlayer insulating layer ILD. In one or more embodiments, each of the first electrode SD1 and the second electrode SD2 may include a conductive material. Examples of conductive materials that may be used as each of the first electrode SD1 and the second electrode SD2 may include aluminum, platinum, palladium, silver, magnesium, gold, nickel, neodymium, iridium, chromium, lithium, calcium, molybdenum, titanium, tungsten, copper, and/or the like. These may be used alone or in combination with each other.

The first electrode SD1 may contact the source area of the active pattern AP through a contact hole formed by removing portions of the first gate-insulating layer GI1, the second gate-insulating layer GI2, and the interlayer insulating layer ILD. The second electrode SD2 may contact the drain area of the active pattern AP through a contact hole formed by removing portions of the first gate-insulating layer GI1, the second gate-insulating layer GI2, and the interlayer insulating layer ILD.

The active pattern AP, the first gate electrode GE1, the second gate electrode GE2, the first electrode SD1, and the second electrode SD2 may form a circuit structure CS. For example, the circuit structure CS may define the pixel circuit PXC described with reference to FIGS. 2 and 3. In one or more embodiments, the first fan-out line FOL1 and the second fan-out line FOL2 may be spaced apart from the circuit structure CS on a plane. That is, the first fan-out line FOL1 and the second fan-out line FOL2 may not overlap the circuit structure CS on a plane.

The first via insulating layer VIA1 may be located on the interlayer insulating layer ILD, and may cover the first electrode SD1 and the second electrode SD2. In one or more embodiments, the first via insulating layer VIA1 may include an organic insulating material. Examples of organic insulating materials that may be used as the first via insulating layer VIA1 may include photoresist, polyacrylic resin, polyimide resin, acrylic resin, and/or the like. These may be used alone or in combination with each other.

The third electrode SD3 may be located on the first via insulating layer VIA1. The third electrode SD3 may contact the second electrode SD2 through a contact hole formed by removing a portion of the first via insulating layer VIA1. In one or more embodiments, the third electrode SD3 may include a conductive material. Examples of conductive materials that may be used as the third electrode SD3 may include aluminum, platinum, palladium, silver, magnesium, gold, nickel, neodymium, iridium, chromium, lithium, calcium, molybdenum, titanium, tungsten, copper, and/or the like. These may be used alone or in combination with each other.

The second via insulating layer VIA2 may be located on the first via insulating layer VIA1, and may cover the third electrode SD3. In one or more embodiments, the second via insulating layer VIA2 may include an organic insulating material. Examples of organic insulating materials that may be used as the second via insulating layer VIA2 may include photoresist, polyacrylic resin, polyimide resin, acrylic resin, and/or the like. These may be used alone or in combination with each other.

The transmission line TL may be located on the second via insulation layer VIA2. The transmission line TL may contact the third electrode SD3 through a contact hole formed by removing a portion of the second via insulating layer VIA2. That is, the transmission line TL may be connected to the circuit structure CS through the third electrode SD3. In one or more embodiments, the transmission line TL may include a conductive material.

The third via insulating layer VIA3 may be located on the second via insulating layer VIA2, and may cover the transmission line TL. In one or more embodiments, the third via insulating layer VIA3 may include an organic insulating material. Examples of organic insulating materials that may be used as the third via insulating layer VIA3 may include photoresist, polyacrylic resin, polyimide resin, acrylic resin, and/or the like. These may be used alone or in combination with each other.

Each of the first pixel electrode PE1 and the second pixel electrode PE2 may be located on the third via insulating layer VIA3. In one or more embodiments, the first pixel electrode PE1 may contact the transmission line TL through a first contact hole CNT1 formed by removing a portion of the third via insulating layer VIA3. The second pixel electrode PE2 may contact the transmission line TL through a second contact hole CNT2 formed by removing a portion of the third via insulation layer VIA3. In one or more embodiments, each of the first pixel electrode PE1 and the second pixel electrode PE2 may include a conductive material. Examples of conductive materials that may be used as each of the first pixel electrode PE1 and the second pixel electrode PE2 may include aluminum, platinum, palladium, silver, magnesium, gold, nickel, neodymium, iridium, chromium, lithium, calcium, molybdenum, titanium, tungsten, copper, indium tin oxide, indium zinc oxide, and/or the like. These may be used alone or in combination with each other.

The pixel defining layer PDL may be located on the third via insulating layer VIA3. An opening exposing at least a portion of each of the first pixel electrode PE1 and the second pixel electrode PE2 may be defined in the pixel defining layer PDL. In one or more embodiments, the pixel defining layer PDL may include an organic insulating material. Examples of organic insulating materials that may be used as the pixel defining layer PDL may include photoresist, polyacrylic resin, polyimide resin, acrylic resin, and/or the like. These may be used alone or in combination with each other.

The first light-emitting layer EL1 may be located on the first pixel electrode PE1, and the second light-emitting layer EL2 may be located on the second pixel electrode PE2. For example, the first light-emitting layer EL1 may be located on the first pixel electrode PE1 exposed by the opening of the pixel defining layer PDL, and the second light-emitting layer EL2 may be located on the second pixel electrode PE2 exposed by the opening of the pixel defining layer PDL. In one or more embodiments, each of the first light-emitting layer EL1 and the second light-emitting layer EL2 may include an organic material, and may emit light of a corresponding or preset color.

The common electrode CE may be located on the first light-emitting layer EL1, the second light-emitting layer EL2, and the pixel defining layer PDL. In one or more embodiments, the common electrode CE may include a conductive material. Examples of conductive materials that may be used as the common electrode CE may include aluminum, platinum, silver, magnesium, gold, chromium, tungsten, titanium, and/or the like. These may be used alone or in combination with each other.

The first pixel electrode PE1, the first light-emitting layer EL1, and the common electrode CE may form the first light-emitting diode LD1. The second pixel electrode PE2, the second light-emitting layer EL2, and the common electrode CE may form the second light-emitting diode LD2. Each of the first light-emitting diode LD1 and the second light-emitting diode LD2 may emit light based on a driving current transmitted from the circuit structure CS. In one or more embodiments, the first light-emitting diode LD1 may overlap the circuit structure CS on a plane, and the second light-emitting diode LD2 may be spaced apart from the circuit structure CS on the plane. In addition, the second light-emitting diode LD2 may overlap at least one of the first fan-out line FOL1 and the second fan-out line FOL2 on a plane. However, the present disclosure is not limited thereto. For example, the second light-emitting diode LD2 may be spaced apart from the first fan-out line FOL1 and the second fan-out line FOL2 on a plane.

The encapsulation layer TFE may be located on the common electrode CE. For example, the encapsulation layer TFE may have a structure in which inorganic layers and organic layers are alternately stacked. In one or more embodiments, the encapsulation layer TFE may include an insulating material. The encapsulation layer TFE may reduce or prevent foreign substances penetrating into the first light-emitting layer EL1 and the second light-emitting layer EL2.

Figure 6:
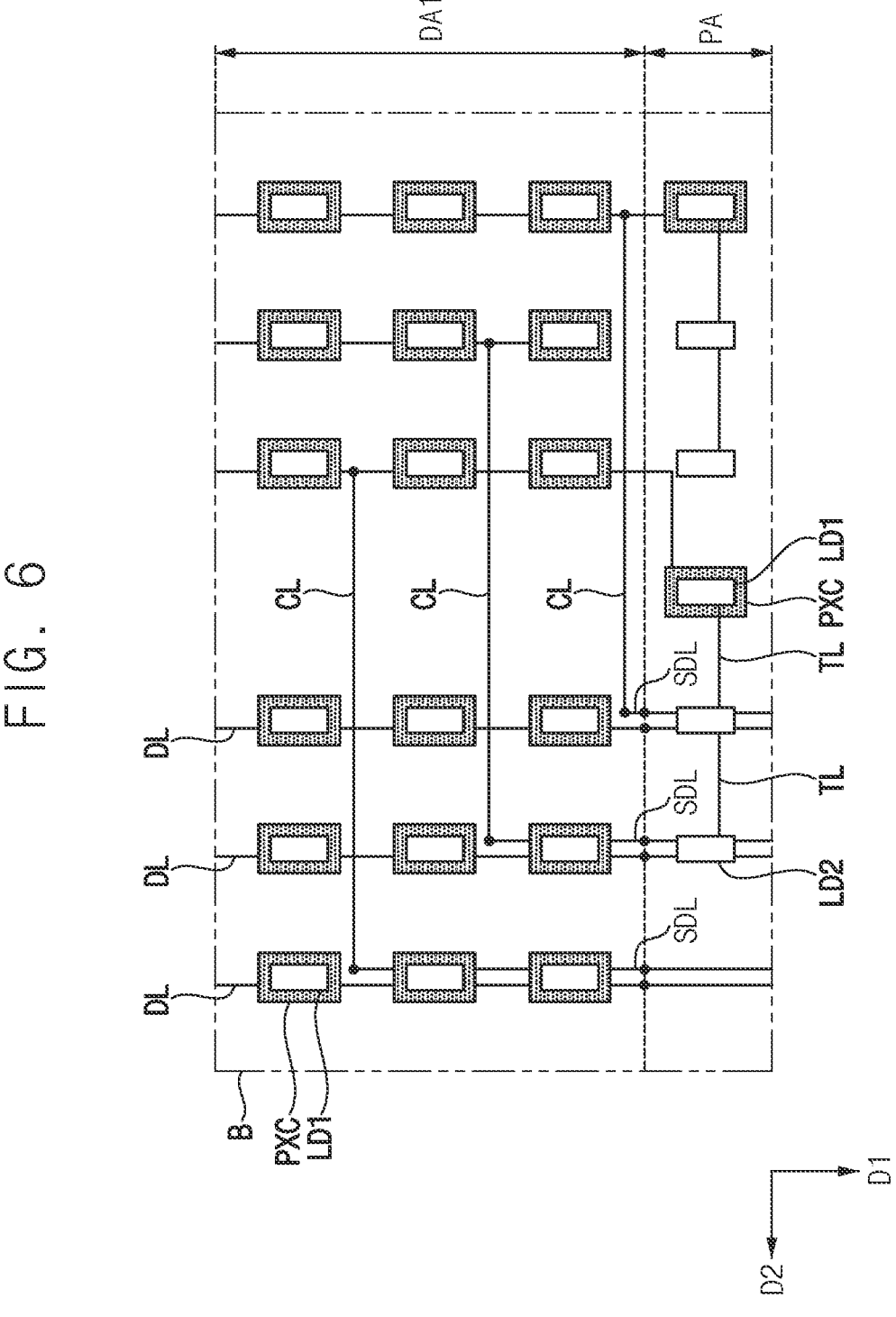
FIG. 6 is a plan view illustrating another example of FIG. 3.

FIG. 5 is a plan view illustrating another example of FIG. 2. FIG. 6 is a plan view illustrating another example of FIG. 3.

Referring to FIGS. 5 and 6, the pixel circuits PXC, the light-emitting diodes LD, the data lines DL, the fan-out lines FOL, the auxiliary data lines SDL, the connection lines CL, and the transmission lines TL may be located on a substrate SUB.

Hereinafter, descriptions overlapping those of the display device 10 described with reference to FIGS. 2 and 3 will be omitted or simplified.

In one or more embodiments, each of the transmission lines TL in the peripheral area PA may connect the first light-emitting diode LD1 and a plurality of the second light-emitting diodes LD2 to a same one pixel circuit PXC among the pixel circuits PXC. That is, each of the transmission lines TL may connect a first light-emitting diode LD1 and a second light-emitting diode LD2, which is adjacent to the first light-emitting diode LD1, or may connect the second light-emitting diode LD2 and another second light-emitting diode LD2, which is adjacent to the second light-emitting diode LD2, to connect the first light-emitting diode LD1 and the plurality of second light-emitting diodes LD2 to the pixel circuit PXC overlapping the first light-emitting diode LD1. For example, one first light-emitting diode LD1 and five second light-emitting diodes LD2 may be connected to one pixel circuit PXC (see FIG. 5), or one first light-emitting diode LD1 and two second light-emitting diodes LD2 may be connected to one pixel circuit PXC (see FIG. 6). However, the present disclosure is not limited thereto. For example, one first light-emitting diode LD1 and three, four, six, or more second light-emitting diodes LD2 may be connected to one pixel circuit PXC.

In one or more embodiments, the fan-out lines FOL may be located adjacent to a center of the peripheral area PA. In addition, the pixel circuits PXC may be respectively located at a first end spaced apart from the center of the peripheral area PA in the second direction D2 and at a second end facing the first end. That is, the pixel circuits PXC may be located on left and right sides of the peripheral area PA on a plane.

Figure 8:
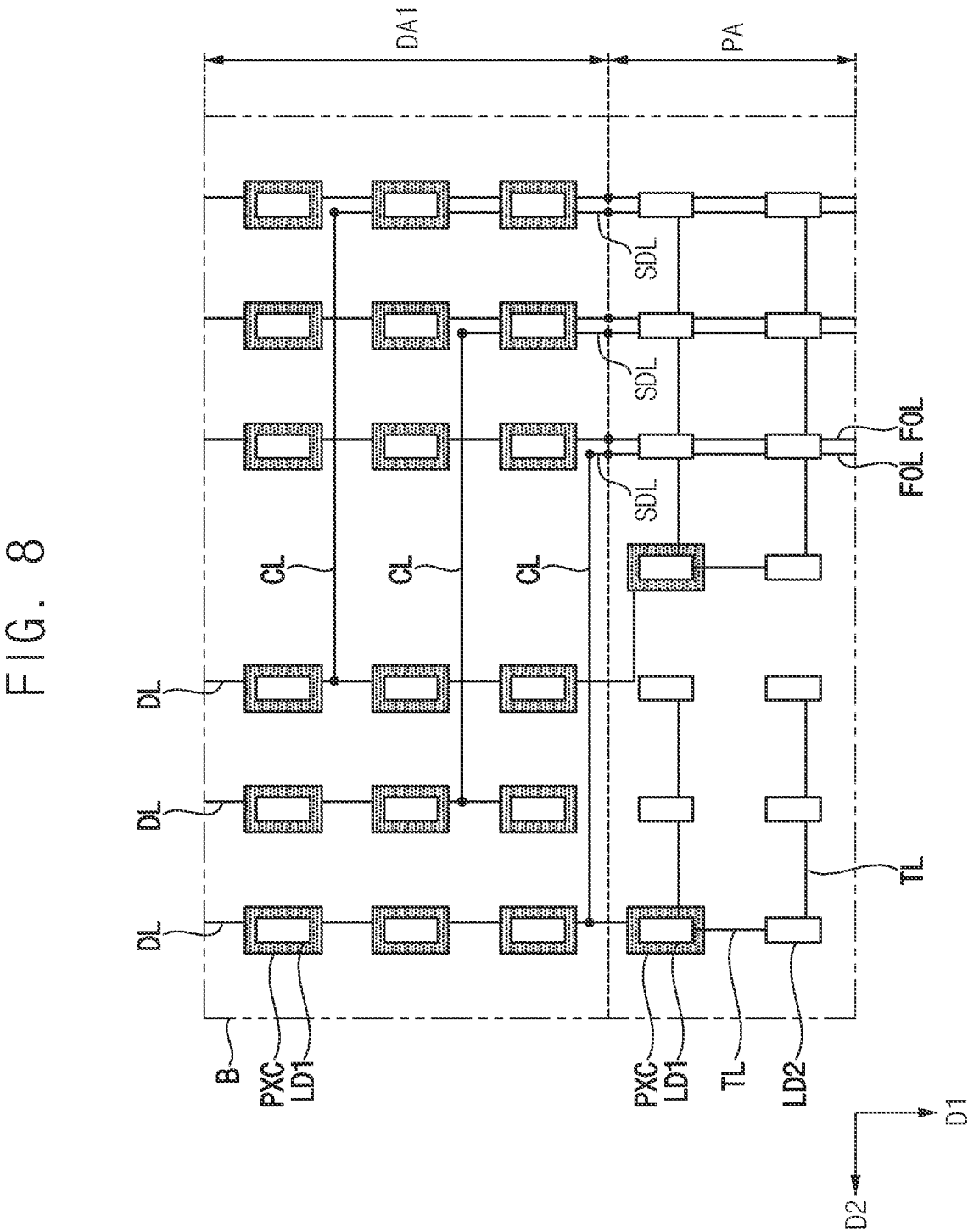
FIG. 8 is a plan view illustrating still another example of FIG. 3.

FIG. 7 is a plan view illustrating still another example of FIG. 2. FIG. 8 is a plan view illustrating still another example of FIG. 3.

Referring to FIGS. 7 and 8, the pixel circuits PXC, the light-emitting diodes LD, the data lines DL, the fan-out lines FOL, the auxiliary data lines SDL, the connection lines CL, and the transmission lines TL may be located on or above the substrate SUB.

Hereinafter, descriptions overlapping those of the display device 10 described with reference to FIGS. 5 and 6 will be omitted or simplified.

In the peripheral area PA, each of the transmission lines TL may connect the first light-emitting diode LD1 and a plurality of second light-emitting diodes LD2 to a same one pixel circuit PXC among the pixel circuits PXC.

In one or more embodiments, the pixel circuits PXC may be located adjacent to the center of the peripheral area PA. In addition, the fan-out lines FOL may be respectively located at the first end spaced apart from the center of the peripheral area PA in the second direction D2 and at the second end facing, or opposite to, the first end. That is, the fan-out lines FOL may be located on the left and right sides of the peripheral area PA on a plane.

Figure 9:
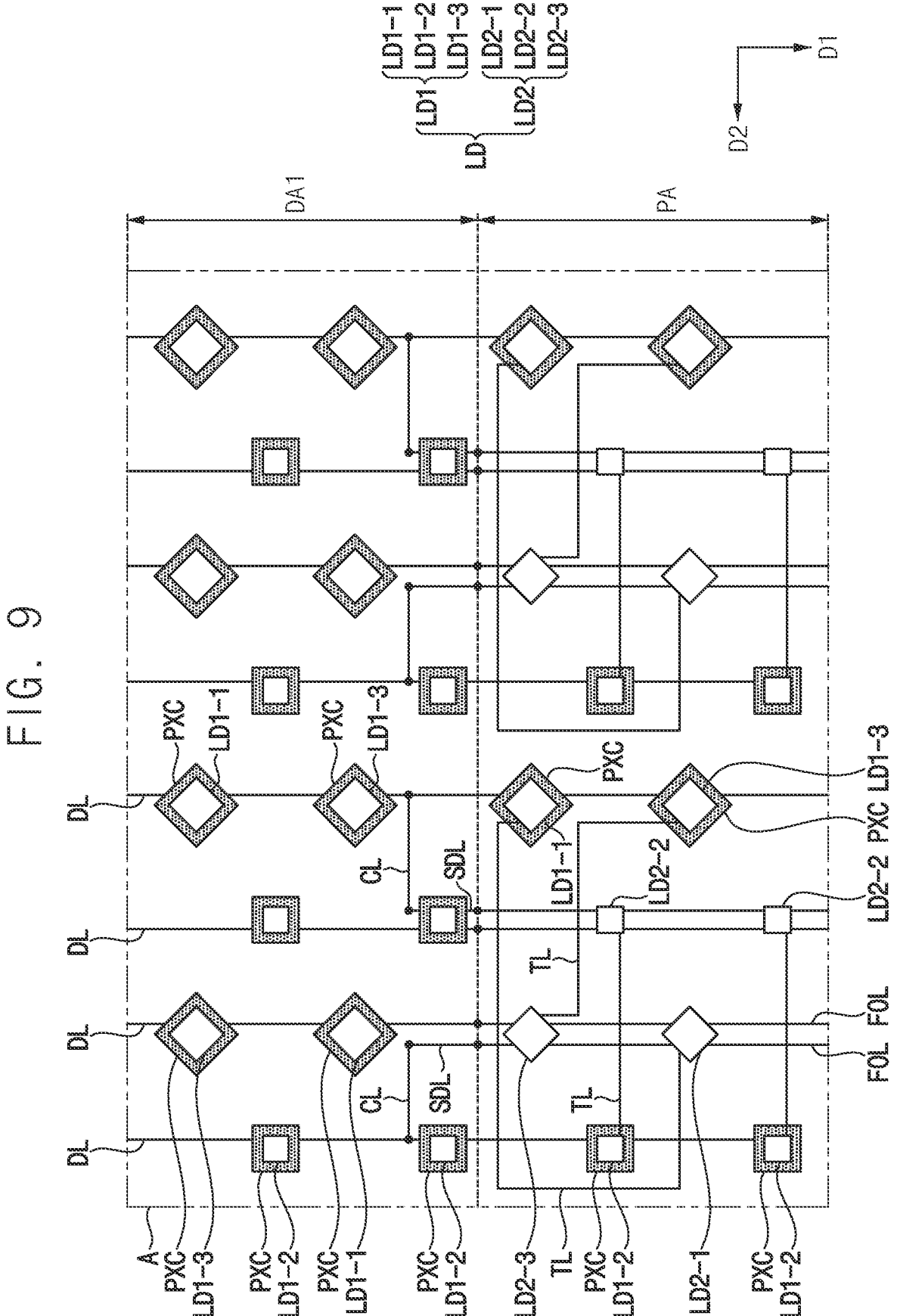
FIG. 9 is a plan view illustrating still another example of FIG. 2.

FIG. 9 is a plan view illustrating still another example of FIG. 2.

Referring to FIG. 9, the pixel circuits PXC, the light-emitting diodes LD, the data lines DL, the fan-out lines FOL, the auxiliary data lines SDL, the connection lines CL, and transmission lines TL may be located on or above the substrate SUB.

The light-emitting diodes LD may include the first light-emitting diode LD1 overlapping each of the pixel circuits PXC on a plane, and the second light-emitting diode LD2 spaced apart from each of the pixel circuits PXC on a plane.

The first light-emitting diode LD1 may include a (1-1)th light-emitting diode LD1-1, a (1-2)th light-emitting diode LD1-2, and a (1-3)th light-emitting diode LD1-3. In one or more embodiments, the (1-1)th light-emitting diode LD1-1, the (1-2)th light-emitting diode LD1-2, and the (1-3)th light-emitting diode LD1-3 may emit light of different respective colors. For example, the (1-1)th light-emitting diode LD1-1 may emit red light, the (1-2)th light-emitting diode LD1-2 may emit green light, and the (1-3)th light-emitting diode LD1-3 may emit blue light, but the present disclosure is not limited thereto.

In one or more embodiments, each of the (1-1)th light-emitting diode LD1-1 and (1-3)th light-emitting diode LD1-3 may have a rhombic planar shape, and the (1-2)th light-emitting diode LD1-2 may have a rectangular planar shape. In addition, the (1-3)th light-emitting diode LD1-3 may have a largest size, and the (1-2)th light-emitting diode LD1-2 may have a smallest size. However, the present disclosure is not limited thereto. For example, each of the (1-1)th light-emitting diode LD1-1, the (1-2)th light-emitting diode LD1-2, and the (1-3)th light-emitting diode LD1-3 may have various polygonal planar shapes or circular planar shapes, or may have various sizes.

The second light-emitting diode LD2 may include a (2-1)th light-emitting diode LD2-1, a (2-2)th light-emitting diode LD2-2, and a (2-3)th light-emitting diode LD2-3. In one or more embodiments, the (2-1)th light-emitting diode LD2-1, the (2-2)th light-emitting diode LD2-2, and the (2-3)th light-emitting diode LD2-3 may emit light of different colors from each other. For example, the (2-1)th light-emitting diode LD2-1 may emit red light, the (2-2)th light-emitting diode LD2-2 may emit green light, and the (2-3)th light-emitting diode LD2-3 may emit blue light, but the present disclosure is not limited thereto.

In one or more embodiments, each of the (2-1)th light-emitting diode LD2-1 and the (2-3)th light-emitting diode LD2-3 may have a rhombus planar shape, and the (2-2)th light-emitting diode LD2-2 may have a rectangular planar shape. In addition, the (2-3)th light-emitting diode LD2-3 may have a largest size, and the (2-2)th light-emitting diode LD2-2 may have a smallest size. However, the present disclosure is not limited thereto. For example, each of the (2-1)th light-emitting diode LD2-1, the (2-2)th light-emitting diode LD2-2, and the (2-3)th light-emitting diode LD2-3 may have various polygonal planar shapes or circular planar shapes, or may have various sizes.

In one or more embodiments, the arrangement of the light-emitting diodes LD in the first display area DA1 may be substantially the same as the arrangement of the light-emitting diodes LD in the peripheral area PA. That is, the arrangement of the first light-emitting diodes LD1 in the first display area DA1 may be substantially the same as the arrangement of the first light-emitting diodes LD1 and the second light-emitting diodes LD2 in the peripheral area PA.

For example, in the first display area DA1, the (1-1)th light-emitting diodes LD1-1 and the (1-3)th light-emitting diodes LD1-3 may be alternately arranged along the second direction D2 in a first row. In the first display area DA1, the (1-2)th light-emitting diodes LD1-2 may be repeatedly arranged along the second direction D2 in a second row adjacent to the first row. In addition, in the first display area DA1, the (1-2)th light-emitting diodes LD1-2 may be repeatedly arranged along the first direction D1 in a first column. In the first display area DA1, the (1-1)th light-emitting diodes LD1-1 and the (1-3)th light-emitting diodes LD1-3 may be alternately arranged along the first direction D1 in a second column adjacent to the first column.

In the peripheral area PA, the (1-1)th light-emitting diodes LD1-1 and the (2-3)th light-emitting diodes LD2-3 may be alternately arranged along the second direction D2 in a first row. In the peripheral area PA, the (1-2)th light-emitting diodes LD1-2 and the (2-2)th light-emitting diodes LD2-2 may be alternately arranged along the second direction D2 in a second row adjacent to the first row. In the peripheral area PA, the (1-3)th light-emitting diodes LD1-3 and the (2-1)th light-emitting diodes LD2-1 may be alternately arranged along the second direction D2 in a third row adjacent to the second row.

In addition, in the peripheral area PA, the (1-2)th light-emitting diodes LD1-2 may be repeatedly arranged along the first direction D1 in a first column. In the peripheral area PA, the (2-1)th light-emitting diodes LD2-1 and the (2-3)th light-emitting diodes LD2-3 may be alternately arranged along the first direction D1 in a second column adjacent to the first column. In the peripheral area PA, the (2-2)th light-emitting diodes LD2-2 may be repeatedly arranged along the first direction D1 in a third column adjacent to the second column. In the peripheral area PA, the (1-1)th light-emitting diodes LD1-1 and the (1-3)th light-emitting diodes LD1-3 may be alternately arranged along the first direction D1 in a fourth column adjacent to the third column.

Each of the transmission lines TL may connect the first light-emitting diode LD1 and the second light-emitting diode LD2 to a same one pixel circuit PXC among the pixel circuits PXC in the peripheral area PA. For example, the transmission line TL may connect the (1-1)th light-emitting diode LD1-1 and the (2-1)th light-emitting diode LD2-1 to connect the (1-1)th light-emitting diode LD1-1 and the (2-1)th light-emitting diode LD2-1 to the pixel circuit PXC overlapping the (1-1)th light-emitting diode LD1-1. In addition, the transmission line TL may connect the (1-2)th light-emitting diode LD1-2 and the (2-2)th light-emitting diode LD2-2 to connect the (1-2)th light-emitting diode LD1-2 and the (2-2)th light-emitting diode LD2-2 to the pixel circuit PXC overlapping the (1-2)th light-emitting diode LD1-2. In addition, the transmission line TL may connect the (1-3)th light-emitting diode LD1-3 and the (2-3)th light-emitting diode LD2-3 to connect the (1-3)th light-emitting diode LD1-3 and the (2-3)th light-emitting diode LD2-3 to the pixel circuit PXC overlapping the (1-3)th light-emitting diode LD1-3.

In one or more embodiments, the transmission lines TL may be located on a same layer on the cross section. In this case, the transmission lines TL may be spaced apart from each other on the cross section. In one or more other embodiments, the transmission lines TL may be located on different layers on the cross section. In this case, the transmission lines TL may overlap each other on the cross section.

In the display device 10 according to one or more embodiments, the display device 10 may include the pixel circuits PXC and the light-emitting diodes LD located in the peripheral area PA adjacent to the first display area DA1. The fan-out lines FOL may be located in the peripheral area PA, and the fan-out lines FOL may supply the data voltages from the data driver DDV to the pixel circuits PXC. Because the pixel circuits PXC are spaced apart from the fan-out lines FOL, and two or more light-emitting diodes LD are connected to one pixel circuit PXC through the transfer line TL, a light-emitting area of the display device 10 may be extended downward. Accordingly, a dead space of the display device 10 may be reduced.

Figure 10:
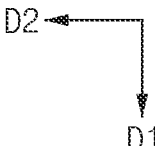
FIG. 10 is a plan view illustrating a display device according to one or more other embodiments.
Figure 11:
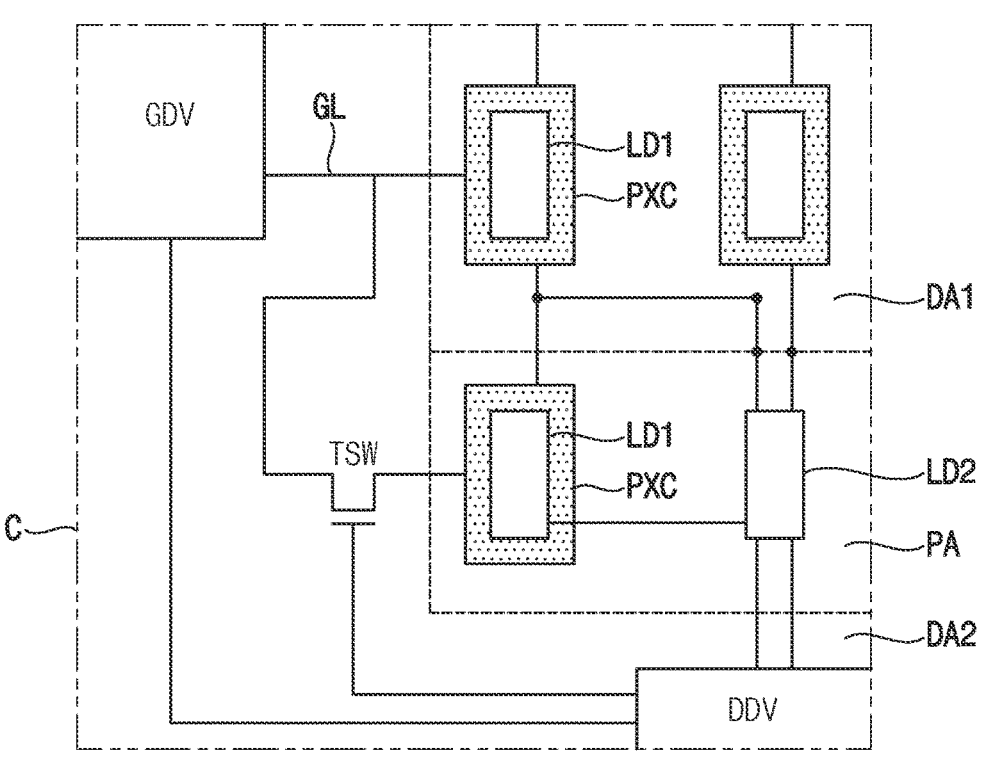
FIG. 11 is an enlarged plan view of area C of FIG. 10.
Figure 12:
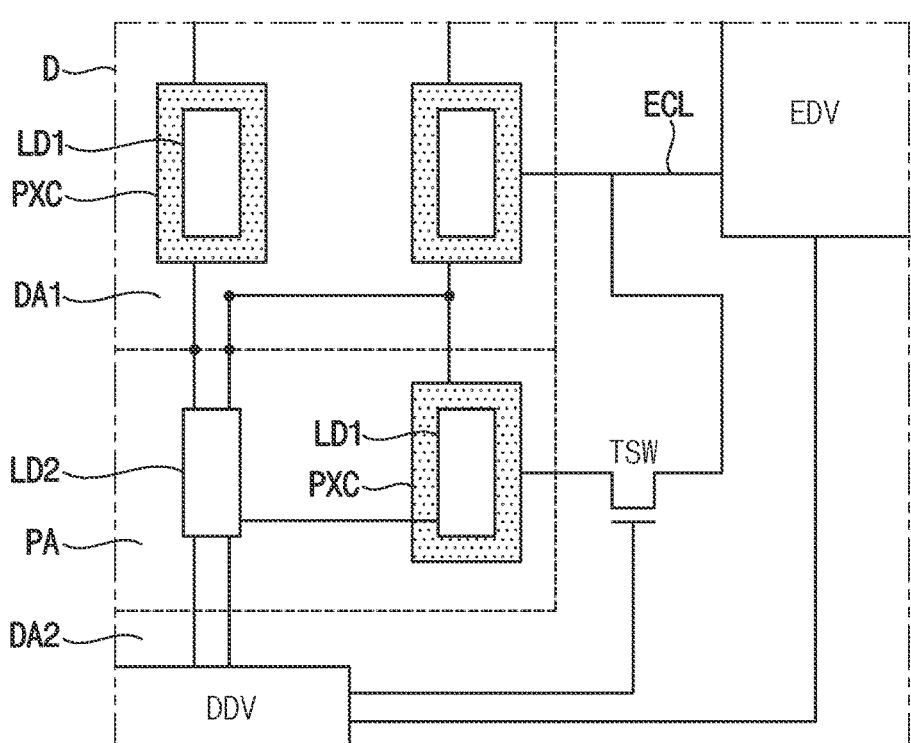
FIG. 12 is an enlarged plan view of area D of FIG. 10.

FIG. 10 is a plan view illustrating a display device according to one or more other embodiments. FIG. 11 is an enlarged plan view of area C of FIG. 10. FIG. 12 is an enlarged plan view of area D of FIG. 10.

Referring to FIGS. 10, 11 and 12, a display device 20 may include the substrate SUB. The first display area DA1, the peripheral area PA, and the second display area DA2 may be defined on the substrate SUB.

Hereinafter, descriptions overlapping those of the display device 10 described with reference to FIG. 1 will be omitted or simplified.

Drivers for displaying images of the first display area DA1, the peripheral area PA, and the second display area DA2 may be located in the second display area DA2. For example, the drivers may include the data driver DDV, the gate driver GDV, the light-emitting driver EDV, and/or the like. In one or more embodiments, a switching transistor TSW, which controls driving of the pixel circuit PXC located in the peripheral area PA, may be located in the second display area DA2.

For example, when the data driver DDV supplies a control signal having a low level to the switching transistor TSW, the switching transistor TSW may be turned off. In this case, the gate driver GDV may not provide the gate signal to the pixel circuit PXC, and the light-emitting driver EDV may not provide the light-emitting control signal to the pixel circuit PXC.

In contrast, when the data driver DDV supplies a control signal having a high level to the switching transistor TSW, the switching transistor TSW may be turned on. In this case, the gate driver GDV may provide the gate signal to the pixel circuit PXC, and the light-emitting driver EDV may provide the light-emitting control signal to the pixel circuit PXC.

Accordingly, the pixel circuits PXC located in the peripheral area PA and the pixel circuits PXC located in the first display area DA1 may be independently driven through same drivers (e.g., the gate driver GDV and the light-emitting driver EDV).

Figure 13:
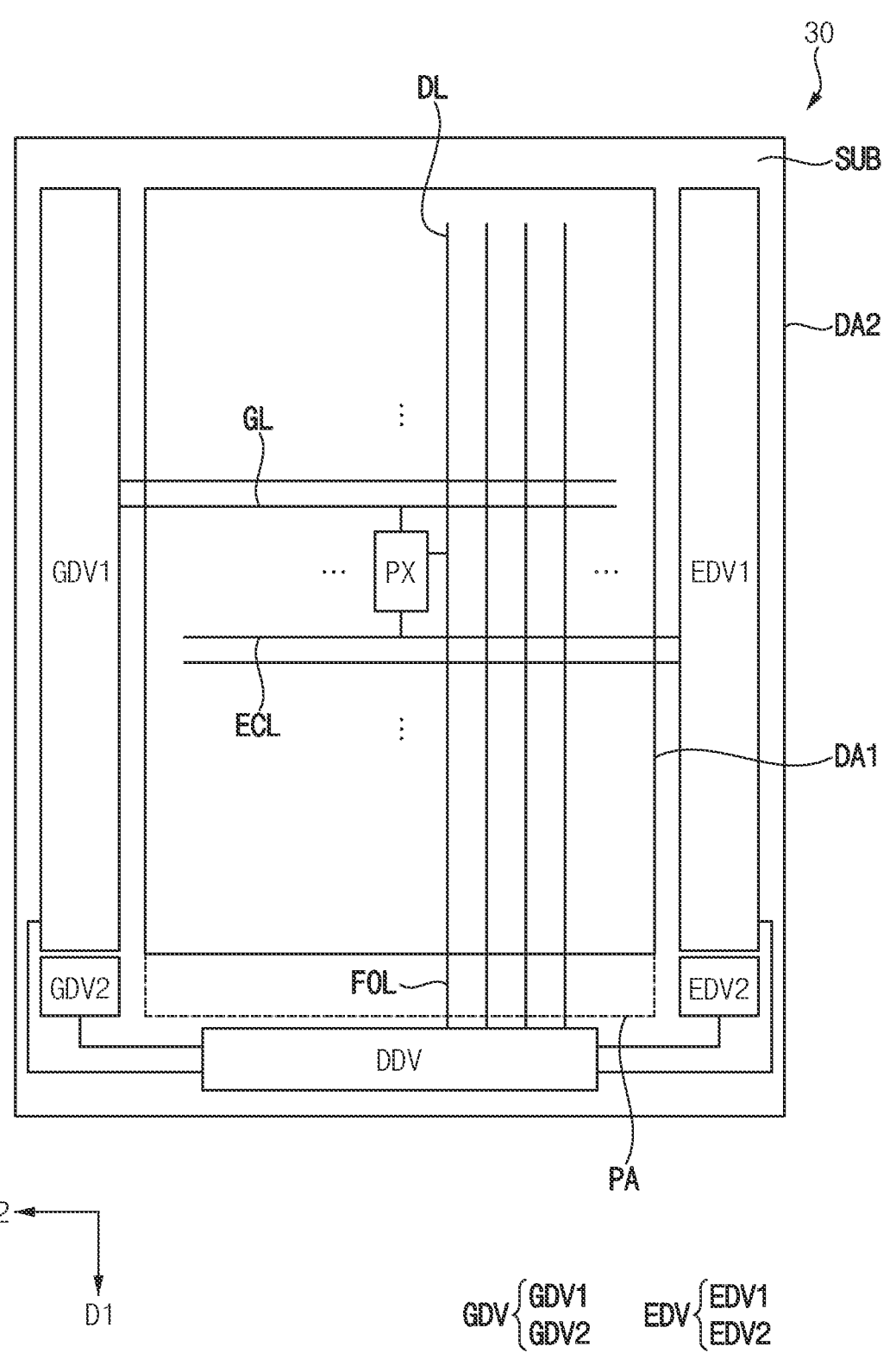
FIG. 13 is a plan view illustrating a display device according to still one or more other embodiments.

FIG. 13 is a plan view illustrating a display device according to still one or more other embodiments.

Referring to FIG. 13, a display device 30 may include the substrate SUB. The first display area DA1, the peripheral area PA, and the second display area DA2 may be defined on the substrate SUB.

Hereinafter, descriptions overlapping those of the display device 10 described with reference to FIG. 1 will be omitted or simplified.

Drivers for displaying images of the first display area DA1, the peripheral area PA, and the second display area DA2 may be located in the second display area DA2. For example, the drivers may include the data driver DDV, the gate driver GDV, the light-emitting driver EDV, and/or the like. In one or more embodiments, the gate driver GDV may include a first gate driver GDV1 connected to the pixel circuits PXC located in the first display area DA1, and a second gate driver GDV2 connected to the pixel circuits PXC located in the peripheral area PA. The first gate driver GDV1 and the second gate driver GDV2 may be spaced apart from each other. In addition, the light-emitting driver EDV may include a first light-emitting driver EDV1 connected to the pixel circuits PXC located in the first display area DA1, and a second light-emitting driver EDV2 connected to the pixel circuits PXC located in the peripheral area PA. The first light-emitting driver EDV1 and the second light-emitting driver EDV2 may be spaced apart from each other.

For example, the first gate driver GDV1 may generate the gate signal, and may supply the gate signal to the gate lines GL located in the first display area DA1. The second gate driver GDV2 may generate the gate signal, and may supply the gate signal to the gate lines GL located in the peripheral area PA.

In addition, the first light-emitting driver EDV1 may generate the light-emitting control signal, and may supply the light-emitting control signal to the light-emitting control lines ECL located in the first display area DA1. The second light-emitting driver EDV2 may generate the light-emitting control signal, and may supply the light-emitting control signal to the light-emitting control lines ECL located in the peripheral area PA.

Accordingly, the pixel circuits PXC of the peripheral area PA and the pixel circuits PXC of the first display area DA1 may be independently driven through different gate drivers (e.g., the first gate driving unit GDV1 and the second gate driving unit GDV2) and different light-emitting drivers (e.g., the first light-emitting driver EDV1 and the second light-emitting driver EDV2).

The present disclosure can be applied to various display devices. For example, the present disclosure is applicable to various display devices such as display devices for vehicles, ships and aircraft, portable communication devices, display devices for exhibition or information transmission, medical display devices, and/or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims, with functional equivalents thereof to be included therein.

What is claimed is:

1. A display device comprising:
   a substrate defining a display area, and a peripheral area adjacent to the display area in a first direction;
   data lines in the display area above the substrate, and extending in the first direction;
   pixel circuits in the peripheral area above the substrate;
   light-emitting diodes in the peripheral area above the substrate, and respectively coupled to the pixel circuits; and
   fan-out lines in the peripheral area above the substrate, respectively coupled to the data lines, and spaced apart from the pixel circuits on a plane.

2. The display device of claim 1, wherein the light-emitting diodes comprise a first light-emitting diode respectively overlapping the pixel circuits on the plane, and a second light-emitting diode spaced apart from the pixel circuits on the plane.

3. The display device of claim 2, wherein the first light-emitting diode and the second light-emitting diode are coupled to a same one of the pixel circuits through a transmission line.

4. The display device of claim 2, wherein the second light-emitting diode overlaps at least one of the fan-out lines on the plane.

5. The display device of claim 1, further comprising a connection line in the display area above the substrate, extending in a second direction crossing the first direction, and coupling at least one of the fan-out lines to a respective one of the data lines.

6. The display device of claim 1, wherein the fan-out lines are adjacent to a center of the peripheral area, and
  wherein the pixel circuits are respectively at a first end spaced apart from the center of the peripheral area in a second direction crossing the first direction, and at a second end opposite to the first end.

7. The display device of claim 1, wherein the pixel circuits are adjacent to a center of the peripheral area, and
  wherein the fan-out lines are respectively at a first end spaced apart from the center of the peripheral area in a second direction crossing the first direction, and at a second end opposite to the first end.

8. The display device of claim 1, further comprising a driver in an area adjacent to the display area above the substrate.

9. The display device of claim 8, wherein the driver comprises:
  a first gate driver configured to provide a first signal to one of the pixel circuits in the display area; and
  a second gate driver spaced apart from the first gate driver, and configured to provide a second signal that is identical to the first signal to another one of the pixel circuits in the peripheral area.

10. The display device of claim 8, wherein the driver comprises:
  a first light-emitting driver configured to provide a first signal to one of the pixel circuits in the display area; and
  a second light-emitting driver spaced apart from the first light-emitting driver, and configured to provide a second signal that is identical to the first signal to another one of the pixel circuits in the peripheral area.

11. A display device comprising:
  a substrate defining a display area, and a peripheral area adjacent to the display area;
  at least one circuit structure in the peripheral area above the substrate, and defining a pixel circuit;
  a first fan-out line in the peripheral area above the substrate, and spaced apart from the circuit structure on a plane;
  a second fan-out line above the first fan-out line;
  a transmission line above the second fan-out line; and
  a first pixel electrode and a second pixel electrode above the transmission line, and coupled to the transmission line.

12. The display device of claim 11, wherein the first pixel electrode overlaps the circuit structure on the plane, and
  wherein the second pixel electrode is spaced apart from the circuit structure on the plane.

13. The display device of claim 11, further comprising an insulating layer above the transmission line,
  wherein a first contact hole and a second contact hole are defined by the insulating layer,
  wherein the first pixel electrode contacts the transmission line through the first contact hole, and
  wherein the second pixel electrode contacts the transmission line through the second contact hole.

14. The display device of claim 11, wherein the second pixel electrode overlaps the first fan-out line or the second fan-out line on the plane.

15. The display device of claim 11, wherein the transmission line is coupled to the circuit structure.

16. The display device of claim 11, further comprising data lines in the display area above the substrate,
  wherein the first fan-out line and the second fan-out line are coupled to the data lines, respectively.

17. The display device of claim 16, further comprising a connection line above the substrate,
  wherein the first fan-out line or the second fan-out line is coupled to one of the data lines through the connection line.

18. The display device of claim 17, wherein the connection line is in the display area.

19. The display device of claim 11, wherein the circuit structure comprises:
  an active pattern above the substrate;
  a first gate electrode above the active pattern; and
  a second gate electrode above the first gate electrode.

20. The display device of claim 19, wherein the first gate electrode is above a same layer as the first fan-out line, and
  wherein the second gate electrode is above a same layer as the second fan-out line.

* * * * *